US008853103B2

(12) United States Patent
Sadohara

(10) Patent No.: US 8,853,103 B2
(45) Date of Patent: Oct. 7, 2014

(54) METHOD FOR MANUFACTURING SEMICONDUCTOR WAFER

(71) Applicant: Sumco Techxiv Corporation, Nagasaki (JP)

(72) Inventor: Shinya Sadohara, Nagasaki (JP)

(73) Assignee: Sumco Techxiv Corporation, Nagasaki (JP)

( * ) Notice: Subject to any disclaimer, the term of this patent is extended or adjusted under 35 U.S.C. 154(b) by 0 days.

(21) Appl. No.: 13/839,427

(22) Filed: Mar. 15, 2013

(65) Prior Publication Data

US 2013/0295780 A1    Nov. 7, 2013

Related U.S. Application Data

(62) Division of application No. 13/057,902, filed as application No. PCT/JP2009/064052 on Aug. 7, 2009, now Pat. No. 8,426,297.

(30) Foreign Application Priority Data

Aug. 8, 2008 (JP) ................................ 2008-205818

(51) Int. Cl.
H01L 21/324 (2006.01)
H01L 21/322 (2006.01)
H01L 21/02 (2006.01)
C30B 33/00 (2006.01)
C30B 15/04 (2006.01)
C30B 33/02 (2006.01)
C30B 29/06 (2006.01)

(52) U.S. Cl.
CPC .......... *H01L 21/324* (2013.01); *H01L 21/3225* (2013.01); *H01L 21/02008* (2013.01); *C30B 33/00* (2013.01); *C30B 15/04* (2013.01); *C30B 33/02* (2013.01); *C30B 29/06* (2013.01)
USPC .......................................... 438/795; 438/694

(58) Field of Classification Search
CPC ........ C30B 15/04; C30B 29/06; C30B 33/00; H01L 21/324; H01L 21/02008
USPC ................................................... 438/694, 795
See application file for complete search history.

(56) References Cited

U.S. PATENT DOCUMENTS 6,200,872 B1    3/2001  Yamada
8,377,202 B2    2/2013  Ebara
(Continued)

FOREIGN PATENT DOCUMENTS

EP    2 031 647 A1    3/2009
JP    57-136334 A     8/1982
(Continued)

*Primary Examiner* — Alexander Ghyka
(74) *Attorney, Agent, or Firm* — Greenblum & Bernstein, P.L.C.

(57) ABSTRACT

A method of manufacturing a silicon wafer, an oxygen concentration in a surface layer to be maintained more than a predetermined value while promoting a defect-free layer. Strength of the surface layer can be made higher than that of an ordinary annealed sample as a COP free zone is secured. A method of manufacturing a silicon wafer doped with nitrogen and oxygen, includes growing a single crystal silicon doped with the nitrogen by Czochralski method, slicing the grown single crystal silicon to obtain a single crystal silicon wafer; heat treating the sliced single crystal silicon wafer in an ambient gas including a hydrogen gas and/or an inert gas; polishing the heat treated single crystal silicon wafer, after the heat treatment, such that an obtained surface layer from which COP defects have been removed by the heat treatment is polished away until an outermost surface has a predetermined oxygen concentration.

8 Claims, 4 Drawing Sheets

(56) References Cited

U.S. PATENT DOCUMENTS

| | | |
|---|---|---|
| 2003/0106484 A1 | 6/2003 | Fusegawa et al. |
| 2005/0229842 A1 | 10/2005 | Umeno et al. |
| 2006/0016385 A1 | 1/2006 | Ono et al. |
| 2007/0295265 A1 | 12/2007 | Kimura |
| 2009/0242843 A1 | 10/2009 | Ebara |

FOREIGN PATENT DOCUMENTS

| | | |
|---|---|---|
| JP | 2-208940 A | 8/1990 |
| JP | 3-19687 B2 | 3/1991 |
| JP | 5-144827 A | 6/1993 |
| JP | 6-302594 A | 10/1994 |
| JP | 7-335657 A | 12/1995 |
| JP | 8-245294 A | 9/1996 |
| JP | 9-69526 A | 3/1997 |
| JP | 11-168106 A | 6/1999 |
| JP | 11-260677 A | 9/1999 |
| JP | 2002-43318 A | 2/2002 |
| JP | 2003-257981 A | 9/2003 |
| JP | 2006-4983 A | 1/2006 |
| JP | 2007-242920 A | 9/2007 |
| JP | 2008-28355 A | 2/2008 |

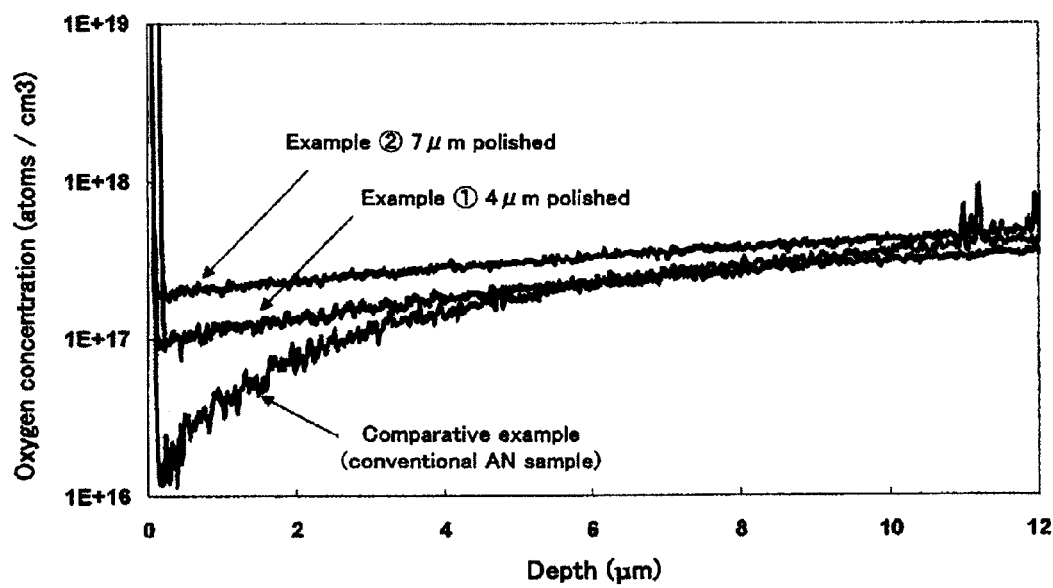
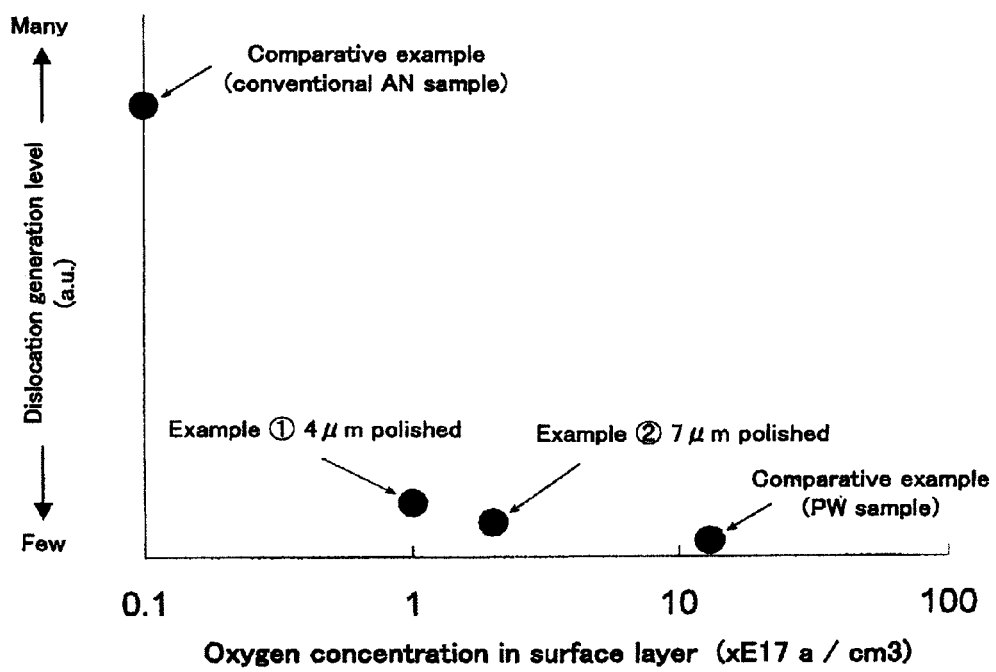

METHOD FOR MANUFACTURING SEMICONDUCTOR WAFER

CROSS-REFERENCE TO RELATED APPLICATION

The present application is a Divisional of U.S. application Ser. No. 13/057,902, which is a National Stage of Application No. PCT/JP2009/064052 filed Aug. 7, 2009, which claims priority to Japanese Application No. 2008-205818 filed Aug. 8, 2008. The disclosures of application Ser. No. 13/057,902 and PCT/JP2009/064052 are expressly incorporated by reference herein in their entireties.

FIELD OF THE INVENTION

The present invention relates to a method of manufacturing a silicon wafer doped with nitrogen and oxygen, and, in particular, relates to a method of manufacturing a silicon wafer, strength of which can be prevented from decreasing because of an insufficient oxygen concentration in a surface of the wafer after a heat treatment thereof.

BACKGROUND ART

It is in high demand to improve the strength and the perfection in a device active region of a surface layer of a silicon wafer because of high integration and miniaturization in the device processing. In addition, it is also in high demand to improve the gettering ability to capture impurities such as metal or the like due to bulk micro defects (BMD) formed from an oxygen precipitate or the like within the bulk.

Therefore, oxygen precipitation is promoted by controlling the growth of the grown-in defects as a silicon monocrystalline ingot doped with nitrogen grows with a Czochralski method. The ingot is sliced such that a single crystal silicon wafer is cut away and polished to obtain a mirror surface thereof. Further, a surface layer of the silicon single crystal wafer having mirror polished surfaces is made to be a non-defect layer and a highly concentrated BMD can be built in the bulk by performing a long-term heat treatment (high temperature annealing) at a temperature from 1100 to 1350° C., a heat treatment (RTA processing) that is conducted by a rapid heating and rapid cooling device (rapid thermal annealing device), or a combination thereof, with an argon gas, a hydrogen gas, or the like used as an ambient gas. In this manner, the perfection of the surface layer and the increase of the density of BMD in the bulk are realized (for example, see Patent Reference 1).

However, during the heat treatment as described above, while unnecessary boron, phosphorus, or the like may be deposited onto the surface of the wafer from the ambient atmosphere in the heat treatment furnace, the heat treatment furnace itself, or the like, and boron, phosphorus, or the like contained in the wafer evaporated from a portion of the surface of the wafer may be deposited back onto another portion of the surface of the wafer, such boron, phosphorus, or the like adhered to the surface diffuses from the surface into inside of the wafer such that a carrier density in the surface layer of the wafer may be changed. For this reason, there is provided a method of manufacturing a nitrogen-doped and annealed silicon wafer having the steps of: heat treating a sliced silicon wafer in an ambient atmosphere including one or more of inert gases such as a hydrogen gas; and mirror polishing the silicon wafer after the above-mentioned heat treatment such that a region in which a so-called dopant such as boron, phosphorus, or the like of the surface layer originated from evaporation and deposition has diffused may be removed (for example, see Patent Reference 2).

Further, there is also provided a method of manufacturing a silicon wafer having the steps of: heat treating a silicon wafer prepared by the CZ method in an ambient atmosphere such as a hydrogen gas or the like; heat treating the silicon wafer for oxidization; removing an oxidized film therefrom; and then polishing the silicon wafer for the final mirror surface finish (for example, see Patent Reference 3). Further, it is proposed to perform a heat treatment of a silicon wafer at the temperature from 1100° C. to 1280° C. for one or more hours and a removal process to remove a surface layer with a depth from 0.5 µm to 20 µm in order to improve the hold time of the memory IC (for example, see Patent Reference 4). In addition, it is also proposed to perform a heat treatment of a silicon wafer in an oxidizing atmosphere or an inert atmosphere in a temperature range of 1000° C. to 1300° C. for 0.5 to 5 hours and a mirror polishing of a primary surface of the silicon wafer in order to reduce the number of surface defects and particles on the surface of the silicon wafer (for example, see Patent Reference 5).

In addition, there is disclosed a method of manufacturing a silicon wafer having the steps of: heat treating a mirror polished silicon wafer; and polishing a surface of the wafer having been heat treated such that a haze having occurred, a foreign material having been printed, and a contact mark having been made with a jig during the heat treatment may be removed from the surface of the wafer (for example, see Patent Reference 6). Further, there is disclosed a method of manufacturing a silicon wafer having the steps of: etching a surface of the silicon wafer, heat treating the silicon wafer in a temperature range of 1200 to 1300° C. for 1 to 24 hours; and mirror polishing either or both surfaces of the silicon wafer such that a COP-free region thereof may be expanded, a surface flatness thereof may be improved, scratches thereon may be eliminated, a haze level thereof may be lowered, foreign materials thereon may be prevented from residing on a surface of the silicon wafer, and a substrate resistance value thereof may be kept constant along a depth direction of the silicon wafer by controlling a decrease of boron concentration with respect to a P-type wafer doped with boron (for example, see Patent Reference 7). In addition, a method of manufacturing a silicon wafer having the steps of: heat treating the silicon wafer in an ambient atmosphere including a hydrogen gas; and mirror polishing the heat-treated silicon wafer in order to effectively remove dopant contaminants during the heat treatment is disclosed (for example, see Patent Reference 2).

[Patent Reference 1] Japanese unexamined patent application publication No. 2002-43318
[Patent Reference 2] Japanese unexamined patent application publication No. 2007-242920
[Patent Reference 3] Japanese unexamined patent application publication No. 11-260677
[Patent Reference 4] Japanese granted patent application publication No. 3-19687
[Patent Reference 5] Japanese unexamined patent application publication No. 5-144827
[Patent Reference 6] Japanese unexamined patent application publication No. 2006-4983
[Patent Reference 7] Japanese unexamined patent application publication No. 2003-257981

DISCLOSURE OF THE INVENTION

Problem to be Solved by the Invention

However, problems in the heat treatment processes as described above have been recognized with respect to the COP elimination (generation of a non-defect layer) and the surface layer diffusion of the dopant. Also, removing a surface layer has been evaluated for the purpose of eliminating contamination, scratches, haze, or the like from the surface layer after the silicon wafer is heat treated. In addition, as a result of such a removal of defects from the surface layer, a contribution could be made to the improvement or the like of the IC hold time. On the other hand, with respect to an oxygen concentration in the silicon wafer, it has been believed that a smaller amount of oxygen concentration in the surface layer is simply more preferable since the non-defect layer is more effectively promoted to be generated and deepened although it is recognized that it is important to maintain the oxygen concentration in a certain level or higher in the bulk as a source of gettering sites. As a matter of fact, it is known that a hydrogen gas and/or an inert gas is preferable for the ambient atmosphere in the heat treatment process and the oxygen in the surface layer diffuses into a gas phase if the heat treatment is conducted in an ambient atmosphere that does not contain oxygen. Accordingly, the oxygen concentration in the surface layer decreases remarkably and it has been believed that this type of decrease of the oxygen concentration near the surface layer contributes to the elimination of the defects and results in a favorable effect on the silicon wafer. However, other effects caused by the oxygen concentration have not been sufficiently investigated.

Means to Solve the Problem

In consideration of the above problems, the present inventor investigated intensively the effect of the oxygen concentration on the silicon wafer and has newly found strength of the silicon wafer (for example, suppressing ability in dislocation) is lowered as the oxygen concentration especially in the surface layer decreases. For example, there was a silicon wafer which had a particularly low oxygen concentration in a surface layer and a non-defect layer sufficiently deep from the surface, but which did not have sufficient strength such that dislocation defects and the like were generated near the surface since the strength of the silicon wafer might not have been high enough as a result thereof. Therefore, there is provided a method of manufacturing a silicon wafer that has a non-defect layer deep enough from a surface thereof and an oxygen concentration sufficiently high enough (hereinafter, referred to as "critical oxygen concentration") to support the strength of the silicon wafer.

Further, it was also found that the depth of the non-defect layer (hereinafter referred to as "non-defect depth") from the surface was more susceptible to a temperature condition and a duration time of the heat treatment than an oxygen concentration in the surface layer such that a method of determining an optimal heat treatment condition having a feature to utilize this is also provided. Here, a silicon wafer cut out from an ingot is supposed to have an approximately constant oxygen concentration from a surface to a bulk thereof. Although oxygen diffuses from the surface into a gas phase if the silicon wafer is heat treated in an inert atmosphere, it is assumed that the oxygen concentration inside the silicon wafer varies due to the diffusion of the oxygen such that it may be relatively easy to predict the concentration distribution. The oxygen concentration of the outermost surface of the silicon wafer may become substantially zero (0) by the heat treatment with a specific condition in an inert atmosphere such that it would be difficult to obtain such a critical oxygen concentration as mentioned above. However, it is possible to obtain a distance (depth) (hereinafter, referred to as "critical depth") by a predetermined diffusion simulation or the like with the boundary condition of this surface. Accordingly, the oxygen concentration on the surface of the silicon wafer as a result of polishing is supposed to be the above-mentioned critical oxygen concentration if the silicon wafer is polished to remove the amount corresponding to the critical depth.

On the other hand, it is not easy to predict a non-defect depth as a depth of the non-defect layer in which no defects exist or all defects disappear since various factors are intricately intertwined. However, if the cooling rate, the nitrogen concentration, and the like are within a fixed range during the crystal growth, the non-defect depth can be unequivocally determined to a certain extent by an ambient gas and a temperature thereof, and a duration time therein of the heat treat treatment. The silicon wafer is polished and a surface thereof is removed up to the above-mentioned critical depth such that the critical oxygen concentration may be exposed to the surface, but the non-defect layer may be utilized afterward for the device processing. Accordingly, the non-defect depth should preferably be larger than the critical depth.

Here, effects of the temperature and the duration time of the heat treatment on the critical depth and the non-defect depth were more closely investigated and it was found that the effects were more remarkable on the non-defect depth. In other words, even if the above-mentioned critical depths are about the same, by slightly changing the temperature and/or the duration time of the heat treatment, the non-defect depth can be significantly deeper (larger) than the critical depth. Accordingly, while the oxygen concentration on the surface of the silicon wafer having been polished is maintained greater than the critical oxygen concentration, the non-defect layer having a necessary depth (for example, a layer for the device processing) can also be secured from the front surface after such polishing. Furthermore, it is preferable that a predetermined concentration of oxygen precipitate defects (BMD: bulk micro defects) exist deeper than (or below) the non-defect layer as gettering sites.

From the above, various coefficients and boundary conditions and the like are obtained by experiments, and heat treatment conditions (primarily, a temperature, a duration time, and a pattern thereof by combining these) which can yield the predetermined critical depth as a diffusion simulation is conducted are obtained. In this case, the critical oxygen concentration may be a concentration to the extent where the generation of dislocation can be substantially prevented. Further, it is preferable that the conditions of the heat treatment to be obtained are the minimally required conditions in order to obtain the critical depth. In other words, it is preferable that the temperature of the heat treatment is the lowest temperature required for the heat treatment and the duration time of the heat treatment is the shortest time required for the heat treatment. This type of heat treatment condition is referred to hereinafter as "critical heat treatment condition." Moreover, it is mentioned that the diffusion simulation is to be performed in the above, but of course, the conditions may also be obtained by repeating trial and error or the like, or by conducting experiments or the like, without conducting any simulation what-so-ever.

Next, the heat treatment conditions are determined such that the non-defect depth is larger than the critical depth, and the difference between these depths is equal to or larger than a depth of the non-defect layer required in a later process. As the temperature of the heat treatment is higher and/or the duration time therefore is longer, and the critical depth, in general, tends to be deeper. This is because the surface diffusion and the bulk diffusion are more effective as the temperature becomes higher or the duration time becomes longer. On the other hand, although the non-defect depth becomes also larger in general at a higher temperature or a longer time within a suitable temperature range and a suitable duration time range of the heat treatment, the degree of impact as given above is significantly greater if compared to the degree of impact on the critical depth. Therefore, if the heat treatment is performed with the predetermined heat treatment condition (hereafter referred to as "present heat treatment condition") at a higher temperature and for a longer duration time than those of the critical heat treatment condition, the non-defect depth will be larger than the critical depth, and the difference in the depths can be expected to be the same or larger than the depth of the non-defect layer required in the later process.

After determining the present heat treatment conditions in this manner, a simulation or an experimentation is performed again to find the depth for the critical oxygen concentration (hereafter referred to as "recalculated depth") which becomes the amount to be removed from the surface by the surface polishing. Further, it is preferable that the non-defect depth is larger than the amount to be removed and it is preferable to make it sure that the depth of the non-defect layer required in the later process is sufficiently secured even after the amount to be removed is actually removed. If it is not sufficient, the calculation of another present heat treatment condition is performed again in a manner as described above by using a higher temperature and a longer duration time for the other present heat treatment condition. In this way, the optimal heat treatment conditions are determined for the present heat treatment condition whereby a great number of silicon wafers can be produced according to this method. Further, according to this manufacturing method, silicon wafers having a favorable defect density distribution can be manufactured and provided.

More specifically, the following may be provided.

(1) A method of manufacturing a silicon wafer doped with nitrogen and oxygen may be provided as the method comprises the steps of: growing a single crystal silicon doped with the nitrogen by Czochralski method; slicing the grown single crystal silicon to obtain a single crystal silicon wafer; heat treating the sliced single crystal silicon wafer in an ambient gas including a hydrogen gas and/or an inert gas; polishing the heat treated single crystal silicon wafer, after the heat treatment, such that an obtained surface layer from which COP defects have been removed by the heat treatment is polished away until an outermost surface has a predetermined oxygen concentration.

Here, the predetermined oxygen concentration may be referred to a concentration in which the surface layer of the silicon wafer has sufficient strength (for example, dislocation resistance). When a heat treatment is performed in an ambient gas not including oxygen, external diffusion of the oxygen occurs from the surface at a predetermined temperature or higher, and the oxygen concentration on the surface becomes substantially zero. Therefore, movement of the oxygen occurs due to the diffusion of oxygen within the silicon wafer. This diffusion can be predicted relatively easily by a simulation based on one-direction unsteady diffusion equation. Further, by repeating preliminary experiments as necessary, the coefficients, boundary conditions, and so on which are necessary for the simulation can be obtained, and the deviation from the actual cases can be corrected. In general, the depth to be polished away would be deeper as the temperature becomes higher or the duration time becomes longer. On the other hand, the non-defect layer depth greatly depends on the temperature and the duration time as well as the nitrogen concentration and is more drastically influenced by the temperature and the duration time than the depth where the predetermined oxygen concentration is achieved. In other words, the non-defect layer becomes deeper if the temperature is higher and the duration time is longer, and the degree of change in the non-defect layer depth is larger than degree of change of the depth where the predetermined oxygen concentration is made. Further, the heat treatment in the ambient gas that includes a hydrogen gas and/or an inert gas is more preferably the heat treatment in the ambient gas consisting of the hydrogen gas and/or the inert gas, and further preferably the heat treatment in the ambient gas consisting of the hydrogen gas. In addition, polishing until the outermost surface has the predetermined oxygen concentration may be referred to polishing the silicon wafer until the oxygen concentration on an exposed surface as a result of the polishing becomes substantially or approximately the same as the predetermined concentration. Further, this phrase may include polishing until the oxygen concentration on the exposed surface becomes the same concentration as or a higher concentration than the predetermined concentration.

(2) The method of manufacturing the silicon wafer according to the above (1), wherein the polishing is performed on both surfaces of the single crystal silicon wafer having been subject to the heat treatment, may be provided.

(3) The method of manufacturing the silicon wafer according to the above (1) or (2), wherein the predetermined oxygen concentration is at least $1 \times 10^{17}$ atoms/cm$^3$, may be provided.

(4) The method of manufacturing the silicon wafer according to any one of the above (1) to (3), wherein the heat treatment is performed at a temperature of at least 1100° C., may be provided. The temperature of the heat treatment is less than the melting point of silicon. Preferably it is not exceeding 1300° C.

(5) The method of manufacturing the silicon wafer according to any one of the above (1) to (4), comprises the step of: etching a surface of the sliced single crystal silicon wafer before the heat treatment.

(6) A method of manufacturing a silicon wafer doped with a predetermined concentration of nitrogen and oxygen may be provided, as the method comprising the steps of: obtaining a heat treatment condition where an oxygen concentration is to become a critical concentration at a predetermined depth D from a surface before the silicon wafer is heat treated in a non-oxidizing atmosphere; and heat treating the silicon wafer in a heat treatment condition including a higher temperature or a longer duration time (hereinafter, referred to as "high/long heat treatment") than that of the obtained heat treatment condition.

Here, the critical concentration of oxygen may be referred to a concentration in the surface layer of the silicon wafer such that the surface layer may have a sufficient strength (for example, dislocation resistance).

(7) The method of manufacturing the silicon wafer according to the above (6), wherein the critical concentration is at least $1 \times 10^{17}$ atoms/cm$^3$, may be provided.

(8) The method of manufacturing the silicon wafer according to the above (6) or (7), wherein a non-defect layer depth is larger than the predetermined depth D when the heat treatment is performed with the high/long heat treatment, may be provided.

(9) The method of manufacturing the silicon wafer according to any one of the above (6) to (8), wherein the predetermined depth D is removed from the silicon wafer surface after the high/long heat treatment, may be provided.

Effect of the Invention

As described above, a silicon wafer may be manufactured, the silicon wafer having a sufficiently strong suppressing ability of the dislocation and the like as well as a sufficient depth of the non-defect layer on the surface securely by performing the heat treatment with a heat treatment condition based on more easily measurable surface oxygen concentration and surface layer oxygen concentration, and by making the oxygen concentration of the outermost surface to be within a predetermined range by removing an amount to be removed by polishing based on the oxygen concentration on the surface and the oxygen concentration of the surface layer.

BRIEF DESCRIPTION OF THE DRAWINGS

FIG. 1 is a graph showing results of measurement of depth profiles of oxygen concentrations by SIMS in silicon wafers of examples of the present invention.

FIG. 2 is a graph in which dislocation generation levels measured by SIRD are plotted against an oxygen concentration in a surface layer.

BEST MODE FOR CARRYING OUT THE INVENTION

Figure 3:
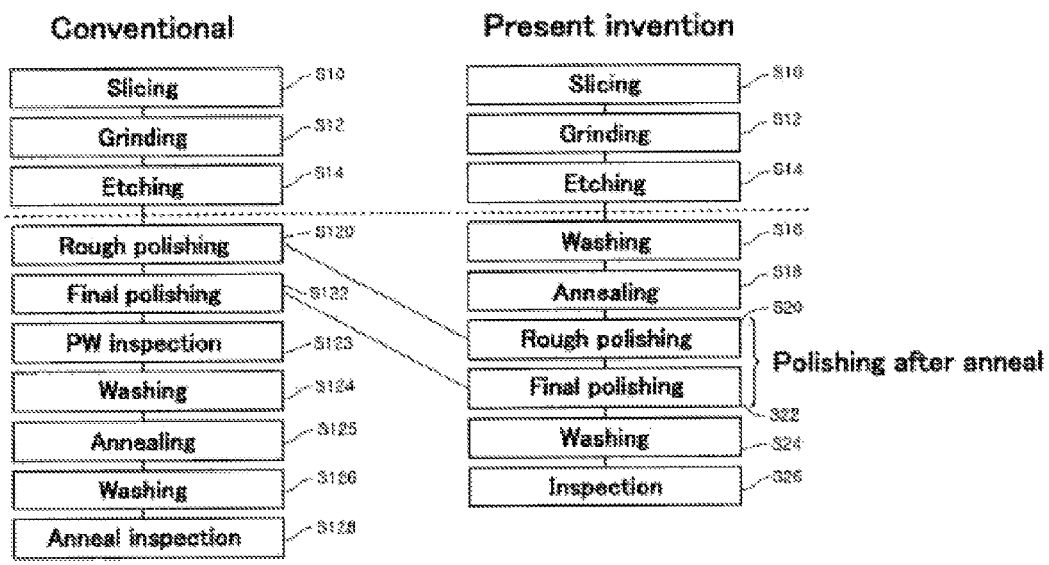
FIG. 3 is a diagram showing a flow of processing steps of an embodiment of the present invention with reference to those of a comparative example.

Although embodiments of the present invention shall now be described in detail with reference to the drawings, the following description is provided to describe the embodiments of the present invention, and the present invention is not limited to these embodiments. Elements of the same or similar kinds will be referred to by the same or related symbols and duplicated descriptions thereof will be omitted.

[Oxygen Concentration]

In general, the oxygen concentration within a silicon wafer manufactured by the CZ method is determined when the crystal is pulled during the manufacturing process of the monocrystalline ingot. Although the concentration of oxygen varies depending on a location in the ingot (for example, a shoulder position and the like) of a portion from which a silicon wafer is sliced out, it is likely that the concentration of oxygen in a single silicon wafer is approximately constant. The concentration of oxygen can be measured, for example, by a sample inspection or the like. The primary diffusion of oxygen in a silicon wafer during the heat treatment is comprised of a vapor phase diffusion from the front surface and rear surface, and a diffusion in solid having the driving force of oxygen concentration distribution within a silicon wafer. Accordingly, one-dimensional unsteady diffusion model may be assumed by setting an oxygen concentration at the infinite position to an actual oxygen concentration of the sliced silicon wafer in a relatively early stage and by setting an oxygen concentration on the surface to zero (0) (or, an empirical value corresponding to zero (0)) after the heat treatment is started with a predetermined temperature. For example, it is assumed that the oxygen concentration within the bulk (at infinite position) is C1: $1\times10^{18}$ atoms/cm$^3$, that the oxygen concentration of the front surface is C0: $1\times10^{16}$ atoms/cm$^3$, and that the diffusion coefficient D is constant. Then, what is to be obtained is the heat treatment conditions such that the critical oxygen concentration of $1\times10^{17}$ atoms/cm$^3$ can be at a predetermined depth (for example, 4 μm). The critical depth is determined in advance with reference to a depth in consideration of the easiness of polishing such that it is taken into account whether the depth can be an exact one to be actually removed, and a depth in consideration of appropriateness such that it is taken into account whether the depth is a preferable one to remove surface peculiar factors such as scratches, contaminations, and the like, which may occur on the surface, and so on. Generally it is preferably at least 4 μm, and more preferably at least 6 μm. Further, since the productivity is lowered if the removal amount is too much, the depth is preferably not exceeding 12 μm and it is more preferably not exceeding 10 μm. More specifically, the following diffusion equation can be solved, for example, by setting the boundary conditions as described above.

$$\partial C/\partial t = D(\partial^2 C/\partial x^2) \quad \text{(Formula 1)},$$

where $C=(C(x)-C0)/C1$, and $z=x/(2\times(D\cdot t)^{0.5})$. The unit of "x" is "μm".

Figure 6:
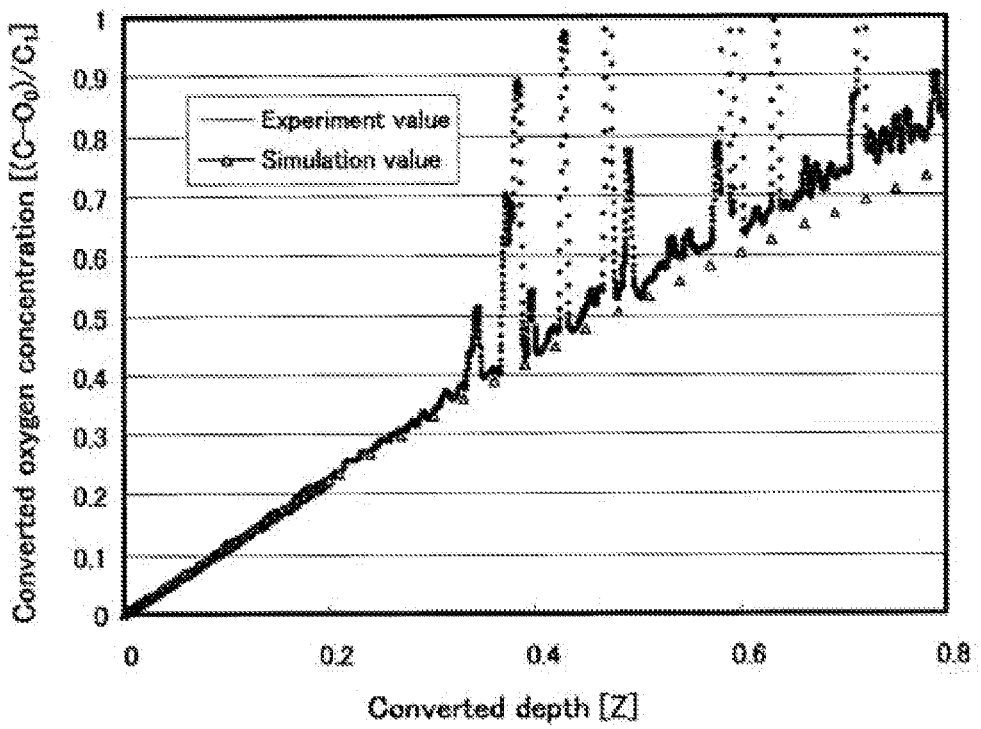
FIG. 6 is a graph showing relationships between converted depth in a wafer and oxygen concentrations in terms of empirical values and simulated values with respect to an embodiment of the present invention.

The diffusion coefficient D of oxygen at about 1200° C. can be estimated to be $3.67\times10^{10}$ (cm$^2$/sec) (see FIG. 6.5 (page 247) of "Semiconductor Silicon Crystal Engineering" by Shimura, Fumio; published by Maruzen Inc.). Accordingly, the following formula may be given by:

$$z=2.61\cdot x/(t)^{0.5}$$

Further, because it is not necessarily possible to obtain the accurate actual concentration distribution, it is also possible to determine the critical heat treatment conditions through experiments. For example, the oxygen concentration distributions from the front surface may be investigated by utilizing samples in various conditions (for example, various combined conditions in a temperature range that is equal to or more than 1150° C. and that is equal to or less than 1205° C., and in a time range that is equal to or more than 0.5 hour and that is equal to or smaller than 10 hours) such that the thus-obtained data may be plotted in a graph or summarized in a list, and the heat treatment conditions are selected such that the critical oxygen concentration can be obtained at the predetermined critical depth.

EXAMPLE

After a ϕ300 mm nitrogen doped crystal (nitrogen doping amount: $6\times10^{13}\sim1\times10^{14}$ atoms/cm$^3$) as a test sample for the experiment was prepared, it was sliced and alkaline-etched. Moreover, the nitrogen doped crystal is a rapid cooled type crystal by a crystal pulling device with a forced cooling mechanism via a water cooled pipe, and the void defect size included in the present crystal was controlled to be from about 70 to 100 nm.

After the silicon wafer was alkaline-etched, it was annealed in an argon atmosphere at 1200° C. for 2 hours. After annealing the silicon wafer, it was polished on both surfaces with a removal amount of 8 to 12 μm (4 to 6 μm on each surface) and then the silicon wafer was finally washed. After the final wash, the silicon wafer was subject to the depth profile measurement of the oxygen concentration by the SIMS, and the surface strength measurement for the strength evaluation.

The results of the depth profile of the oxygen concentration by the SIMS are shown in FIG. 1. In FIG. 1, Example 1 is a silicon wafer where 4 μm was polished away from one surface, and Example 2 is a silicon wafer where 7 μm was polished away from one surface. In contrast to a normal annealed sample (comparative example) in which the oxygen concentration in a surface layer drops to almost $1 \times 10^{16}$ atoms/cm$^3$, the oxygen concentrations of samples in which 4 and 7 μm were polished away after the samples were annealed can be seen to be increased about $1 \times 10^{17}$ atoms/cm$^3$ and $2 \times 10^{17}$ atoms/cm$^3$, respectively. Moreover, the oxygen concentration of the bulk was about $12 \times 10^{17}$ atoms/cm$^3$.

Then, the following surface layer strength evaluation was performed. As the procedure of the evaluation, the test sample was first inserted into an Epitaxial furnace, and a rapid temperature increase/decrease heat treatment was performed with the maximum temperature of 1180° C. Thereafter, using SIRD (Scanning Infrared Depolarization), the generation level of micro stress generated at the contact portions between the wafer and the susceptor holding the wafer within the Epitaxial furnace was measured such that the surface layer strength was evaluated. Moreover, as a reference sample for the experiment, a substrate for an annealing process (having not been annealed) and an ordinary annealed sample (having been annealed after being polishing) were used. The test sample levels having actually been used in the experiment is as follows.

Level 1

Example 1

A test sample polished after being annealed (removed amount: 4 μm from one surface. Surface oxygen concentration: $1 \times 10^{17}$ atoms/cm$^3$)

Level 2

Example 2

A test sample polished after being annealed (removed amount: 7 μm from one surface. Surface oxygen concentration: $2 \times 10^{17}$ atoms/cm$^3$).

Level 3

Comparative Example PW (Polished Wafer)

A substrate for annealing (Reference. Surface oxygen concentration: $13 \times 10^{17}$ atoms/cm$^3$).

Level 4

Comparative Example AN

An ordinary annealed sample (Reference. Surface oxygen concentration: $0.1 \times 10^{17}$ atoms/cm$^3$).

The results are shown in FIG. 2. The horizontal axis of FIG. 2 represents the oxygen concentration in the surface layer, and the vertical axis represents the dislocation generation level measured by SIRD. From this figure, it can be confirmed that the amount of generated dislocations were lowered in comparison with the ordinary annealed sample such that strength of the surface layer was increased to an equivalent level to that of a PW sample. Moreover, it is confirmed that the COP free zones of Level 1 and Level 2 were secured as much as 10 μm and 8 μm, respectively.

In addition, according to the process flow for a conventional annealed sample (see FIG. 3), initially, a monocrystalline ingot is pulled and sliced to obtain a wafer (S10). A surface of the wafer is ground (S12), and further etched (S14). Then, a rough polishing is made to the wafer (S120), which is followed by a final polishing (S122). And the wafer is inspected with respect to the surface conditions (including a surface shape) (S123). Then, after the wafer is washed on the front surface and the like (S124), the wafer is annealed (S125). The wafer is washed again (S126), and after an inspection process (final quality check) is completed (S128), the wafer is shipped as a silicon wafer product. On the other hand, in the present invention, although the process flow from slicing through etching (S10-S14) is the same, the wafer is then washed (S16) prior to the annealing. And the wafer is annealed (S18), and subject to the rough polishing (S20) after the annealing and then the final polishing (S22). Here, the rough polishing (S20) may be omitted depending on the amount to be removed. As described above, since the polishing step is provided after the annealing such that a surface layer is removed, the oxygen concentration in the surface layer (and on the surface itself) can be increased and the strength of the surface layer of the wafer can be increased such that the generation of the dislocations may be suppressed so as to decrease the leak failure rate. Thereafter, the wafer is washed (S24) and inspected (S26) and shipped. In the present invention, for example, since the monocrystalline ingot is pulled and sliced to obtain the wafer, which is etched on the surface and then annealed and polished such that the surface conditions (including the surface shape) and the final quality are examined in the inspection process for shipping out the silicon wafer product, the number of inspection processes may be reduced, thereby enabling the productivity to be improved (see FIG. 3).

Figure 4:
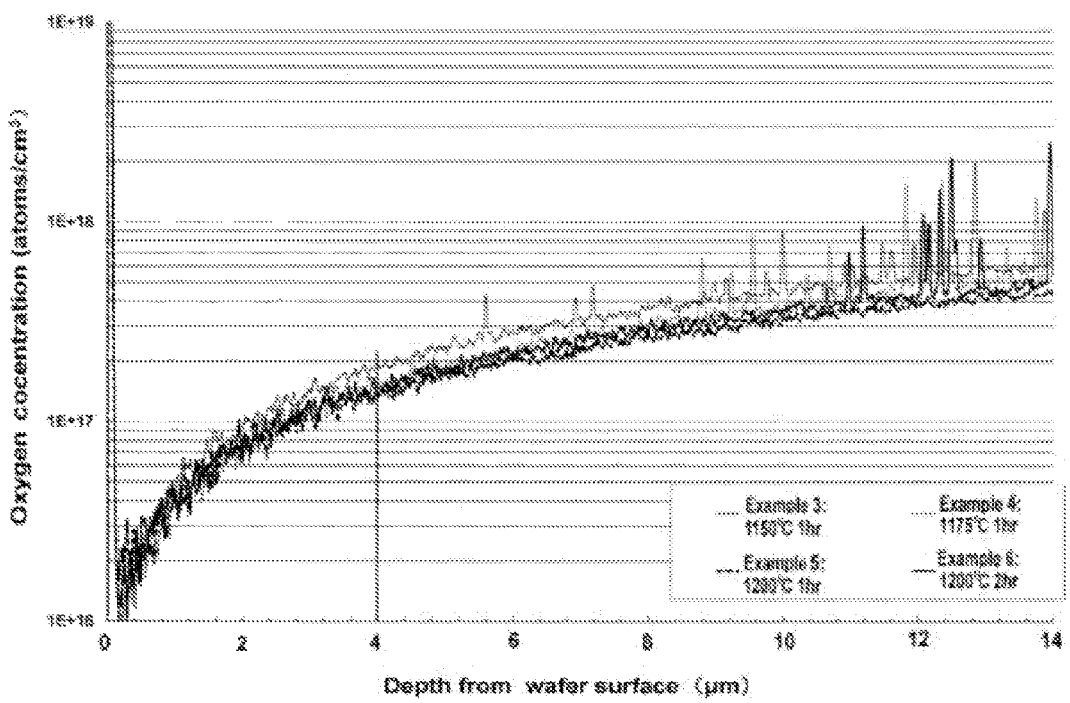
FIG. 4 is a graph showing relationships between oxygen concentrations and depth in a wafer with respect to examples of the present invention.

Test samples were prepared in the same way as used with the above-mentioned Examples 1 and 2 and Examples 3 to 6 (see Table 1) were conducted in heat treatment conditions of 1150° C.×1 hour, 1175° C.×1 hour, 1200° C.×1 hour, and 1200° C.×2 hours, respectively. Profiles of oxygen concentrations of these examples along a depth direction are shown in FIG. 4. As can be seen in FIG. 4, the oxygen concentration of the sample with the heat treatment condition of 1150° C. for 1 hour is higher at any depth if compared with the other samples, and the vapor-phase diffusion of oxygen is less than that of the other samples with the other conditions and a decrease of the oxygen concentration due to the oxygen diffusion in the bulk is rather mild. Meanwhile, with respect to the test samples heat treated at 1175° C. and 1200° C., a difference between oxygen concentrations of the test samples is relatively small. And in the oxygen concentrations of the samples heat treated at 1200° C., in particular, the oxygen concentration of the sample treated for 1 hour tends to be lower than that of the sample treated for 2 hours. Therefore, it is considered that the influence by the experimental errors cannot be necessarily ignored. Accordingly, it is preferable to determine the heat treatment condition in consideration of variance and deviation in order to obtain the critical oxygen concentration. Conversely, it may be assumed that it is unlikely to cause trouble if the heat treatment condition is set to a little excessive one in consideration of the variance of the critical oxygen concentration, even though the following non-defect depth is changed by slightly changing the heat treatment condition such as temperature and duration time.

Figure 5:
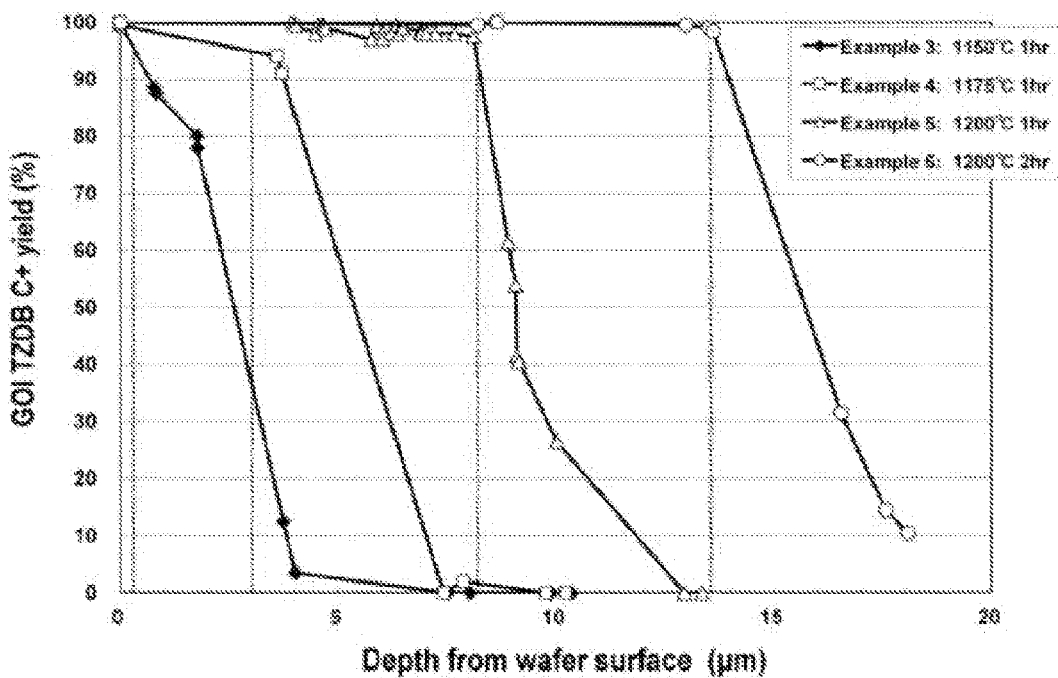
FIG. 5 is a graph showing relationships between defect densities and depth in a wafer with respect to examples of the present invention.

FIG. 5 shows profiles of defect densities in the depth direction. In this figure, it should be understood that the depth of the defect free region becomes larger as the temperature of the heat treatment increases, and that the defect free region becomes also larger as the duration time is longer with the same temperature of 1200° C. In consideration together with the results of FIG. 4, it is apparent that the non-defect depths of samples with conditions of 1200° C. for 1 hour and for 2 hours were changed significantly even though the oxygen concentrations thereof were substantially not changed. These results are summarized in the below table.

TABLE 1

| | Annealing condition | COP Free zone | Oxygen concentration at depth of 4 μm from wafer surface |
|---|---|---|---|
| Example 3 | 1150° C. 1 hr | 0.5 μm | $2 \times 10^{17}$ atoms/cm$^3$ |
| Example 4 | 1175° C. 1 hr | 4 μm | $1.5 \times 10^{17}$ atoms/cm$^3$ |
| Example 5 | 1200° C. 1 hr | 8 μm | $1.5 \times 10^{17}$ atoms/cm$^3$ |
| Example 6 | 1200° C. 2 hr | 13 μm | $1.5 \times 10^{17}$ atoms/cm$^3$ |

As can be seen from Table 1 and from FIGS. 4 and 5, although the annealing conditions were greatly changed, the surface oxygen concentrations were not changed much, whereas the depth of the non-defect layer was greatly changed. That is, initial conditions of a silicon wafer (for example, an oxygen concentration, a nitrogen concentration, etc.) are determined such that a predetermined oxygen concentration is made at a predetermined depth, and a change of the oxygen concentration is predicted by preliminary experiments or a simulation such that the annealing condition is set in order to obtain a desired non-defect depth, whereby a silicon wafer having a sufficiently deep non-defect layer and a sufficiently high mechanical strength can be manufactured.

Figure 7:
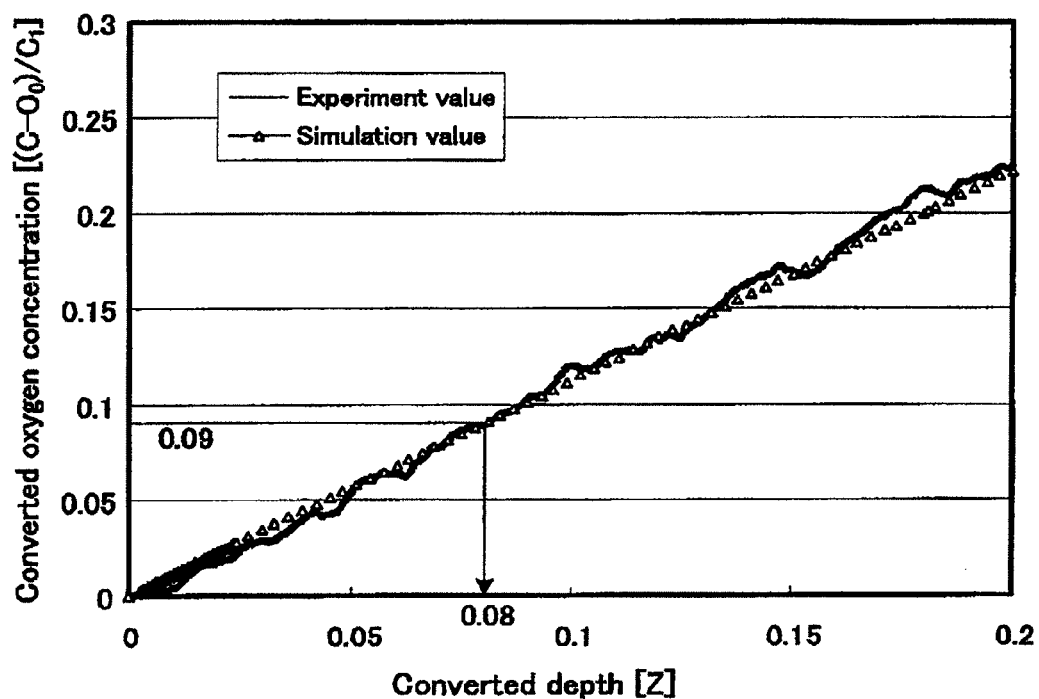
FIG. 7 is a enlarged view of the graph of FIG. 6 where the converted depth is up to 0.2.

Next, an example of a simulation will be described. The above Formula 1 can be solved analytically and the solution can be expressed as an error function of C=erf(z). This is examined in comparison with the conventional annealed sample of FIG. 1 (FIGS. 6 and 7). Since an abnormal value of the oxygen concentration is indicated for the annealed sample at a depth of 0, where the measurement cannot be conducted, an oxygen concentration of $1 \times 10^{16}$ atoms/cm$^3$ is plotted for a depth of 0 μm. FIG. 6 shows a graph in which a converted oxygen concentration is plotted along the vertical axis until a converted depth z (horizontal axis) becomes 0.8. The diamond plots represent experimental values and the open triangle plot represent theoretical values based on the error function in the figure. It can be seen that the theoretical values and the experimental values match well in the range where z is small. Here, the critical depth is to be obtained such that the oxygen concentration is $1 \times 10^{17}$ atoms/cm$^3$ as the critical oxygen concentration at the critical depth. In FIG. 7 in which the converted depth z is up to 0.2, the converted oxygen concentration for the critical oxygen concentration is $(1 \times 10^{17} - 1 \times 10^{16})/1 \times 10^{18} = 0.09$, therefore, the corresponding converted critical depth is 0.08. In other words, the critical depth is given by: $x = (3600 \times 2)^{0.5} \times 0.08/2.61 = 2.60$ μm. As is understood from FIG. 7, the simulation value and the experiment value correspond to each other very well, and either value leads to the same result. However, in the case where an experimental value cannot be obtained by experiments, or before the experiment is conducted, or in the like case, it is possible to obtain the critical depth by utilizing the simulated value as the difference from the experimental value is considered. For example, if the heat treatment is performed for 4 hours with the same initial conditions and the like, the converted depth, assuming a simulated value is utilized, is still 0.08 such that the critical depth may be given by: $x = (3600 \times 4)^{0.5} \times 0.08/2.61 = 3.68$ μm. In this way, the depth where the oxygen concentration is a critical one can be easily obtained by the simulated value or the experimental value such that a silicon wafer which is excellent in the stability can be manufactured.

Further, the strength of the surface layer of the wafer can be enhanced to become higher than that of the ordinary annealed sample while the COP free zone is secured by polishing the annealed wafer on both surfaces by 8 to 20 μm (4 to 10 μm on either surface), after the annealing process, such that the regions where the oxygen concentration is lowered because of the oxygen external diffusion during the annealing process are removed so that the oxygen concentration of the outermost surface layer may be $1 \times 10^{17}$ atoms/cm$^3$ or higher.

For example, as the front surface and the rear surface are polished and a range of 4 to 10 μm are removed from both surfaces, respectively, after the annealing process, the oxygen concentration of the surface layer of the wafer is made to be at least $1-5 \times 10^{17}$ atoms/cm$^3$ or higher, the COP free zone can be secured for at least 3 μm or more in the depth, thereby enabling the surface oxygen concentration to securely maintain at least 10 times as high as that of the ordinary annealed sample. In this way, the mechanical strength of the surface layer of the wafer can be enhanced. In addition, stability of the surface layer resistance can be achieved by removal of dopant contaminations on the surface layer. Further, it is possible to remove burrs, scratches, and the like on portions of the rear surface having contacted with the boat. Further, the inspection process can be provided only after the annealing process such that the productivity may be improved.

What is claimed is:

1. A method of manufacturing a silicon wafer doped with a predetermined concentration of nitrogen and oxygen, comprising:
    obtaining a heat treatment condition where an oxygen concentration is to become a critical concentration at a predetermined depth D from a surface before the silicon wafer is heat treated in a non-oxidizing atmosphere;
    heat treating the silicon wafer in a heat treatment condition including a higher temperature or a longer duration time (hereinafter, referred to as "high/long heat treatment") than that of the obtained heat treatment condition; and
    polishing the surface to remove up to the predetermined depth D after the high/long treatment for device processing on the polished surface afterward,
    wherein the predetermined depth D is determined by a diffusion equation:

$\partial C/\partial t = D(\partial^2 C/\partial x^2)$, where $C = (C(x) - C0)/C1$, $z = x/(2 \times (D \cdot t)^{0.5})$, C is a concentration of oxygen, C0 is a surface oxygen concentration, C1 is a bulk oxygen concentration, D is a diffusion coefficient, and x is a distance in depth.

2. The method of manufacturing the silicon wafer according to claim 1, wherein the critical concentration is at least $1 \times 10^{17}$ atoms/cm$^3$.

3. The method of manufacturing the silicon wafer according to claim 1, wherein a non-defect layer depth is larger than the predetermined depth D when the heat treatment is performed with the high/long heat treatment.

4. The method of manufacturing the silicon wafer according to claim 2, wherein a non-defect layer depth is larger than the predetermined depth D when the heat treatment is performed with the high/long heat treatment.

5. The method of manufacturing the silicon wafer according to claim 1, wherein the heat treatment condition include the higher temperature of at least 1100° C.

6. The method of manufacturing the silicon wafer according to claim 2, wherein the heat treatment condition include the higher temperature of at least 1100° C.

7. The method of manufacturing the silicon wafer according to claim 3, wherein the heat treatment condition include the higher temperature of at least 1100° C.

8. The method of manufacturing the silicon wafer according to claim 1, wherein the predetermined depth D is determined by data obtained from experiments under conditions including a range of temperature and time of the heat treatment.

* * * * *